United States Patent [19]
Horie et al.

[11] Patent Number: 5,634,061
[45] Date of Patent: May 27, 1997

[54] INSTRUCTION DECODER UTILIZING A LOW POWER PLA THAT POWERS UP BOTH AND AND OR PLANES ONLY WHEN SUCCESSFUL INSTRUCTION FETCH SIGNAL IS PROVIDED

[75] Inventors: Atsushi Horie, Niza; Tohru Utsumi, Yokohama, both of Japan

[73] Assignee: Kabushiki Kaisha Toshiba, Kawasaki, Japan

[21] Appl. No.: 232,405

[22] Filed: Apr. 25, 1994

Related U.S. Application Data

[63] Continuation of Ser. No. 703,092, May 22, 1991, abandoned.

[30] Foreign Application Priority Data

| May 24, 1990 | [JP] | Japan | 2-132498 |
| Apr. 26, 1991 | [JP] | Japan | 3-097579 |

[51] Int. Cl.⁶ .................................................. G06F 1/32
[52] U.S. Cl. ................................. 395/750; 364/707
[58] Field of Search ................. 365/227; 395/750, 395/375, 800; 364/707; 327/544

[56] References Cited

U.S. PATENT DOCUMENTS

| 3,599,182 | 8/1971 | Henle | 365/227 |
| 3,987,287 | 10/1976 | Cox et al. | 326/39 |
| 4,151,611 | 4/1979 | Sugawara et al. | 365/227 |
| 4,233,667 | 11/1980 | Devine et al. | 326/40 |
| 4,514,650 | 4/1985 | Yum | 326/43 |
| 4,598,383 | 7/1986 | Leach | 395/750 |
| 4,645,953 | 2/1987 | Wong | 326/42 |
| 4,968,900 | 11/1990 | Harvey et al. | 327/544 |
| 5,033,017 | 7/1991 | Taniai et al. | 364/716 |
| 5,276,824 | 1/1994 | Skruhak et al. | 395/375 |

FOREIGN PATENT DOCUMENTS

| 0325180 | 7/1989 | European Pat. Off. . |
| 59-099823 | 9/1984 | Japan . |
| 61-101124 | 9/1986 | Japan . |
| 63-177165 | 11/1988 | Japan . |
| 2-20924 | 12/1988 | Japan . |
| 2092786 | 8/1982 | United Kingdom . |
| 0180725 | 5/1986 | WIPO . |

*Primary Examiner*—Richard L. Ellis
*Attorney, Agent, or Firm*—Foley & Lardner

[57] ABSTRACT

Disclosed is a programmable logic array (PLA), comprising an AND plane comprising a plurality of input lines and a plurality of product term lines crossing the input lines, an OR plane comprising the product term lines and a plurality of output lines crossing the product term lines, a power source VDD providing an electrical power to the AND and OR planes, and control line for controlling the supply of the electric power to the AND and OR planes, wherein the electrical power from the power source VDD is provided to the PLA when a signal indicating the use of the PLA is provided to the control line, and the supply of the electrical power from the power source VDD to the PLA is stopped on receipt of a signal designating that the PLA is in the unused state. In addition, various data processing systems incorporating the PLA are disclosed.

6 Claims, 8 Drawing Sheets

INSTRUCTION DECODER UTILIZING A LOW POWER PLA THAT POWERS UP BOTH AND AND OR PLANES ONLY WHEN SUCCESSFUL INSTRUCTION FETCH SIGNAL IS PROVIDED

This application is a continuation of application Ser. No. 07/703,092, filed May 22, 1991, now abandoned.

BACKGROUND OF THE INVENTION

1. Field of the Invention

The present invention relates to a low power consumption programmable logic array (PLA) and a data processing system in which the PLA is incorporated.

2. Description of the Prior Art

FIG. 1 is a diagram showing the configuration of a conventional PLA which is frequently used in the prior art.

This PLA is an asynchronous type or a ratio type.

In the diagram, when a high level input signal (H or 1) is provided to an input line 10 which is one of a plurality of input lines which consist of an AND array plane of the PLA, all the array transistors, each of which comprises a N-channel conductivity type transistor, with the drain terminals connected to the input line 10, enter an ON state or an activated state.

For example, a product term line 11 connected to the power source VDD through a load transistor T11 which comprises a P channel conductivity type transistor and is in the ON state at all times is connected to ground through the array transistor T10, when the array transistor T10 enters the ON state.

In such a situation, the magnitude of the potential of the product term line 11 is determined in accordance with the rate between the ON resistance of the load transistor T11 and that of the array transistor T10. The channel conductance of the load transistor T11 is smaller than that of the array transistor T10. Accordingly, the potential of the product term line 11 is switched to a low level from a high level.

When the product term line 11 enters the low level, a plurality of array transistors in an OR array plane connected to the product term lines 11 enter the OFF state.

When the array transistor T12 enters the OFF state, the potential of an output line 12 connected to the power source VDD through a load transistor T13 comprising the P channel conductivity type transistor enters the high level from the low level.

At this time, the other array transistors connected to the output line 12 must be in the OFF state.

Therefore a low level output signal as the reversed potential of the output line 12 is provided to an output terminal OUT1 of the OR array plane.

On the other hand, when a low level input signal is provided to the input line 10 through an input terminal IN1, the operations of the AND and the OR array planes described above are reversed, the electrical potential of the product term line 11 remains at the high level, and the output signal of the high level is provided through the output terminal OUT1.

In the PLA, when the input line 10 is at the high level, the array transistor T10 is ON and a current flows continuously to ground through the transistors T10 and T11 which are in the ON state.

The array transistors other than the array transistor T10 connected to high level input line in the AND array plane are operated similarly.

When the input line is at the low level, an array transistor T12 in the OR array plane remains at the high level and the current flows continuously from the power source VDD to ground through the load transistor T13 and the array transistor T12 which are in the ON state because the product term line 11 is maintained at the high level.

The array transistors for which the gate terminals are connected to the high level product term lines are operated similarly.

Thus, a problem with the conventional PLA in the prior art is that the current flows continuously from the power source VDD to ground through the array and the load transistors when the PLA is activated.

We will explain another problem occurring when the conventional PLA described above is incorporated in a data processing system in the prior art.

FIG. 2 is a block diagram of a data processing system with the conventional PLA.

The data processing system is operated according to the following procedures:

First, instructions written in a machine language stored in the memory 70 are read out by a memory fetch unit 71, then stored in a machine language register 72. At the same time, the instruction fetch unit 72 sets a valid bit register 73a to "1".

The machine language instruction is transferred to a PLA 74, then decoded and set in the micro instruction register 75. At the same time, the content of the valid bit register 73a are set in a valid bit register 73b. An execution unit 76 implements the data processing operation in accordance with the contents of the micro instruction register 75. These units, such as the instruction fetch unit 71, the PLA 74, and the execution unit 76 described above are installed in parallel.

Thus, the steady electrical current flows continuously in the conventional PLA and the data processing system using the conventional PLA when the power source is turned on.

Namely, the electric current flows in the conventional PLA when the power source is turned on and no effective output is provided (hereinafter referred to as the unused state). The power consumption of the PLA or the data processing system in the situation described above is increased by the steady electrical current flowing therein.

The larger the scale of the PLA and the greater the number of the array transistors, the more is the power consumed when the PLA is in the unused state.

Moreover, the power consumption of the PLA is increased when it is in the unused state for a long time.

In the data processing system with the conventional PLA, no effective output of the PLA 74 can be provided when no machine language instruction is stored in the machine language register 72 and when the content of the valid bit register 73a are zero.

The power consumption of the PLA is increased because the PLA 74 is in operation when the content of the valid bit register 73a are zero.

When effective data is stored in the micro instruction register 75 (the contents of the valid bit register 73b are 1) and the execution unit 76 is executing, the contents of the micro instruction register 75 cannot be stored until the operation of the execution unit 76 is finished. Specially, even if an effective output is provided from the PLA 74, it cannot be stored in the micro instruction register 75.

Accordingly, the operation of the PLA 74 has no meaning while the valid bit register 73b is set at 1 and the execution unit 76 is executing. Thus, the power consumption of the PLA 74 is increased.

SUMMARY OF THE INVENTION

An object of the present invention is to provide a low power consumption programmable logic array (PLA) which is capable of reducing the power consumption while the PLA is in the unused state and a data processing system incorporating the PLA.

The PLA provided to overcome the problems above described in the prior art comprises an AND plane comprising a plurality of input lines and a plurality of product term lines crossing the input lines, an OR plane comprising the product term lines and a plurality of output lines crossing the product term lines, a power source providing electric power to the AND and the OR planes, connection control means for controlling the supply of the electric power to the AND and OR planes, wherein the electric power from the power source is provided to the PLA when a signal indicating the use of the PLA is provided to the connecting means, and the supply of the electric power from the power source to the PLA is stopped when signal designating that the PLA is in the unused state is received.

In the PLA with the configuration described above, either a current path of the power source to ground through the product term lines and array transistors connected to the product term lines in the AND plane or a current path of the power source to ground through the output lines and array transistors connected to the output lines in the OR plane is cut off when the PLA is in the unused state, or the two paths described above are cut off.

Accordingly, the power consumption of the PLA according to the present invention can be reduced.

Moreover, the PLA described above can be applied to various data processing systems.

These and other objects, features and advantages of the present invention will be more apparent from the following description of a preferred embodiment, taken in conjunction with the accompanying drawing.

DETAILED DESCRIPTION OF THE EMBODIMENTS

Figure 1:
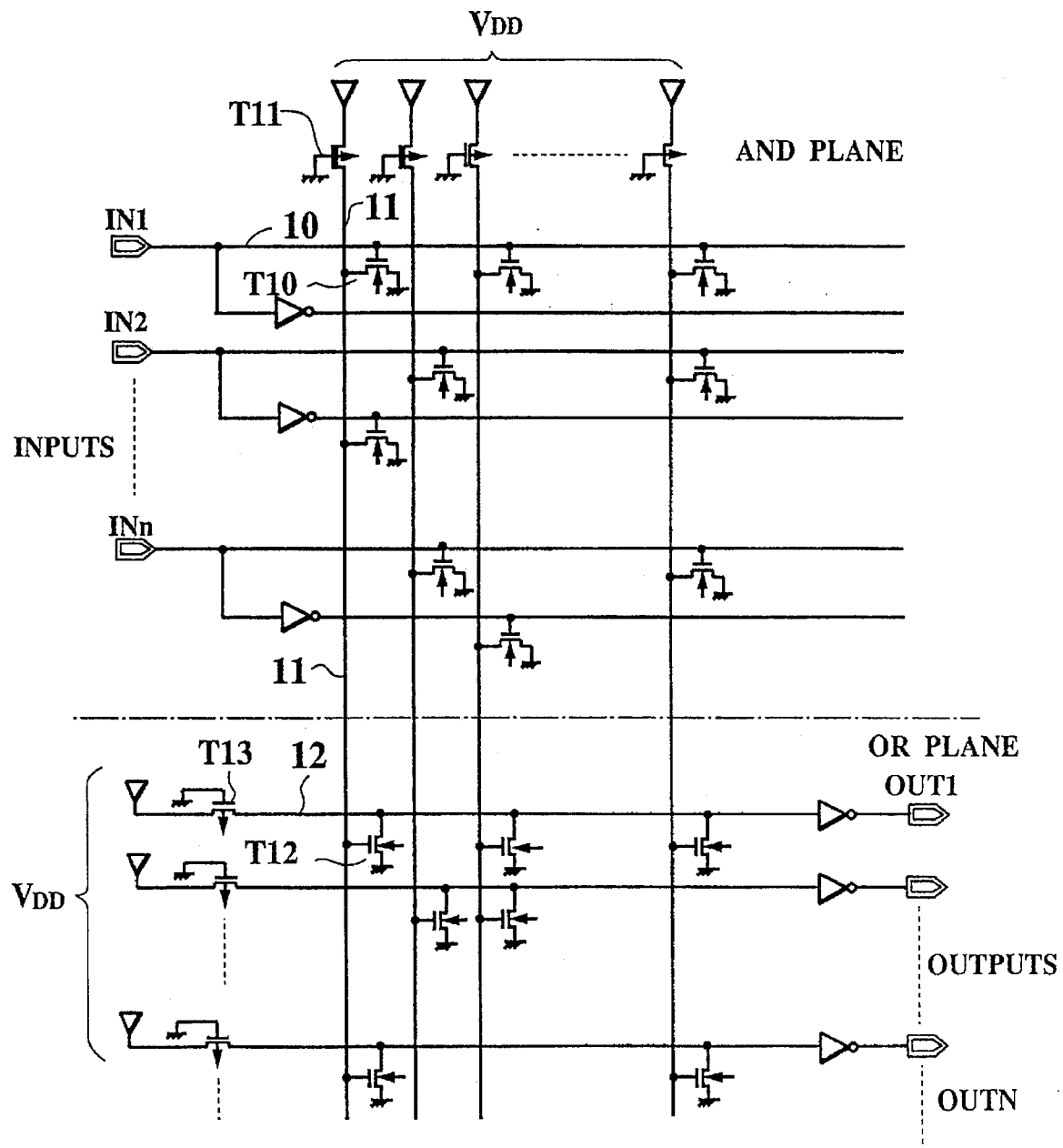
FIG. 1 is a configuration diagram of a conventional PLA.

Preferred embodiments according to the present invention will now be explained referring to the drawings.

Figure 3:
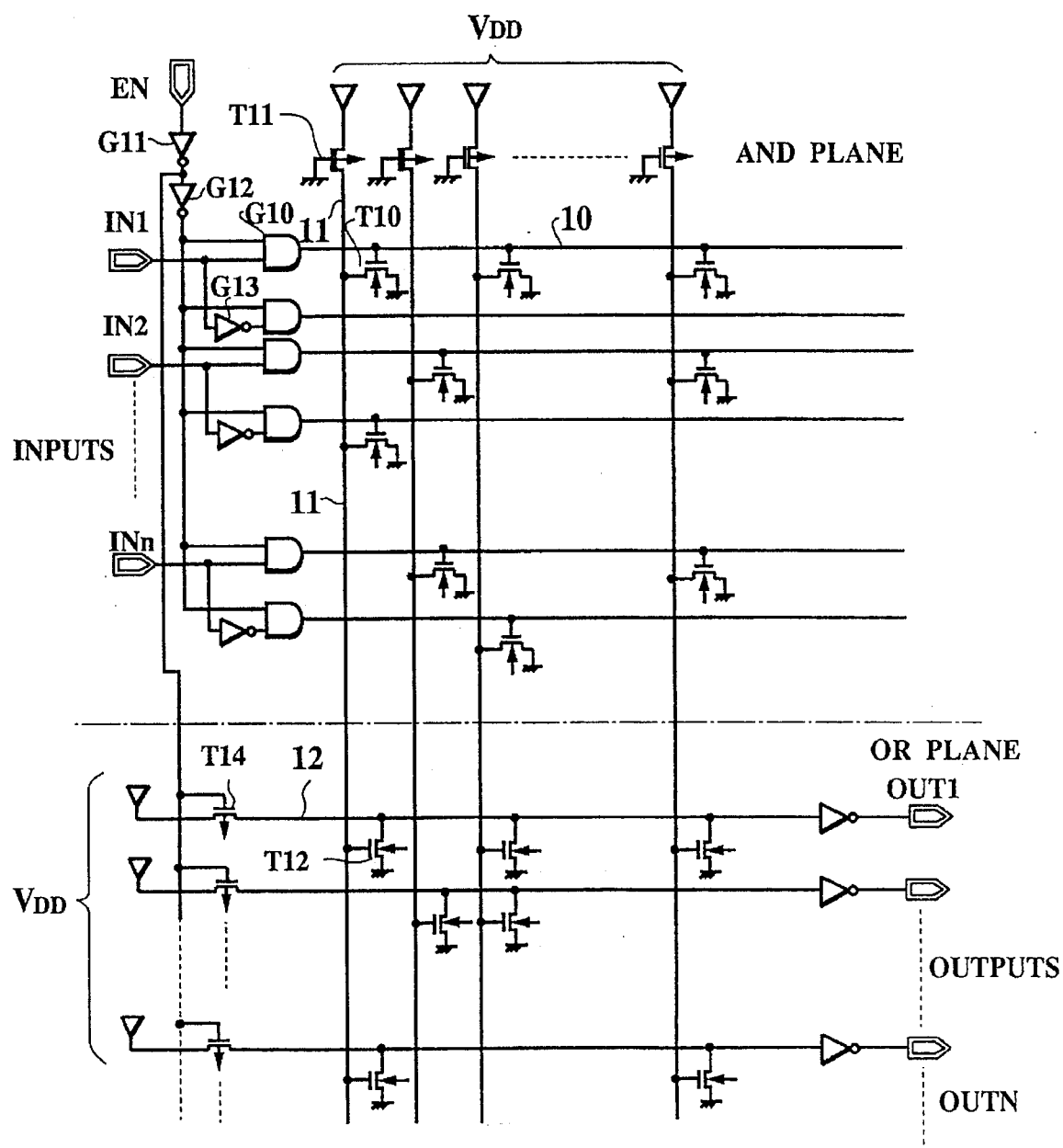
FIG. 3 is a configuration diagram of a PLA as a first embodiment according to the present invention.
Figure 4:
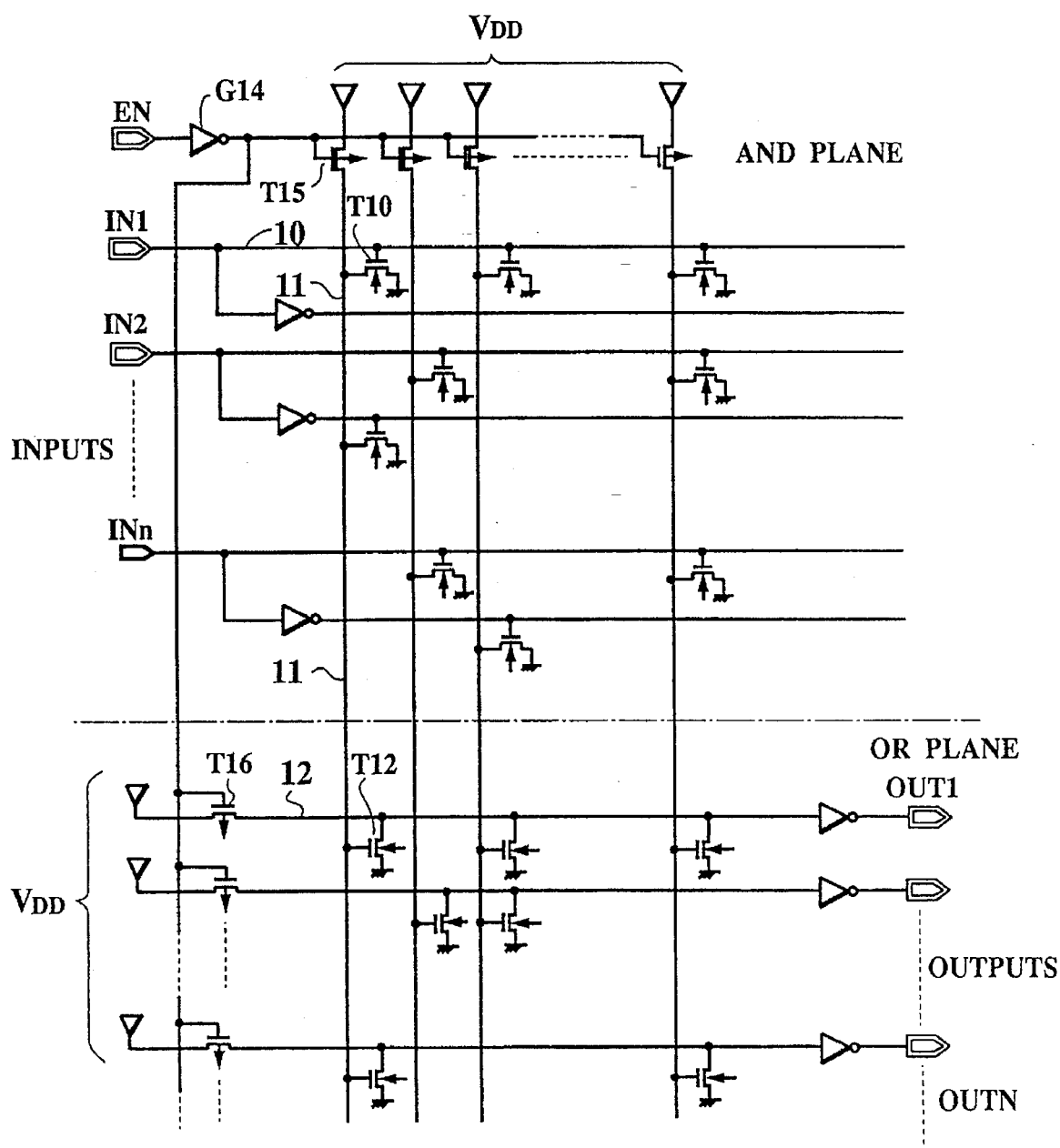
FIG. 4 is a configuration diagram of a PLA as a second embodiment according to the present invention.

FIGS. 3 and 4 are configuration diagrams of a PLA as the first and second embodiment according to the present invention.

In the same diagrams, the PLA, which is a ratio type and an asynchronous type, is incorporated in a LSI system in which a microprocessor as a macro block and a programmable logic device (PLD) are fabricated as independent chips, respectively.

The component elements designated in FIGS. 3 and 4 by the same reference numerals and characters used in FIG. 1 have the same functions, so further explanation is omitted in the present embodiment.

In FIG. 3, each input line 10, which is represented as one of the input lines in an AND plane, is connected to an output terminal of each AND gate G10 which is represented as one of the AND gates in the AND plane. One input terminal of each AND gate is connected to an output terminal of an invert gate (invertor) G12 for which the input terminal is connected to an output terminal of an invertor G11 through which an enable signal is inverted.

The other input terminal of the AND gate G10 is connected to either an output terminal of an invertor G13 or one of input terminals IN1, IN2, . . . , and INn.

On the other hand, each output line 12 which 1s represented as one of output lines in an OR plane is connected to the power source VDD through the load transistor T14 comprising a P channel type transistor for which the gate terminal is connected to an output terminal of the invertor G11.

In such a case, the enable signal of the high level (H) is provided to an enable terminal EN when the PLA enters the used state. One of the input terminals of each AND gate G10 enters the high level, so that either the input signal or the inverted input signal is provided to each input line 10.

Each load transistor T14 enters the ON state because the output terminal of the invertor G11 is at the low level when the high level enable signal is provided to the enable terminal EN. Accordingly, the electrical power of the power source VDD is provided to each output line 12 in an OR array in the PLA.

The operation described above is the same as that in FIG. 1.

On the other hand, when the PLA enters the unused state, the low level enable signal is provided to the enable terminal EN.

In this case, each AND gate G10 enters the low level, so that the potential of each input line 10 enters the low level regardless of the whether the level of the input signal provided to the input terminals IN1, IN2, . . . , and INn is at the low level or the high level. Accordingly, all array transistors T10 connected to the input lines 10 enter the inactive state.

All current paths of the power source VDD to ground through the load transistors are in the active state and the product term lines are cut off, even if all load transistors T11 in the AND plane enter the active state.

Thus, in the unused state of the PLA, no current flows in the PLA so that the power consumption of the PLA can be greatly reduced.

When all array transistors in the AND plane are in the inactive state, all product term lines 11 enter the high level state, so that all array transistors in the OR plane connected to the product term lines 11 enter the active state.

When the enable signal is in the low level state, the gate terminals of all load transistors T14 in the OR plane enter the high level state so that all load transistors enter the inactive state.

The current paths of the power source VDD to ground through the output lines and the array transistors which are in the active state enter the cut off state even if all array transistors in the OR array are active.

Accordingly, since no current flows in the OR array when the PLA is in the inactive state, the power consumption of the PLA can be greatly reduced.

The power consumption P of the PLA with the configuration described above is expressed as follows:

$$P = \sum_i Ii \times V \times (1 - T) \qquad (1)$$

where the current flowing in each load transistor in the PLA is Ii, the voltage of the power source VDD is V, i is a positive integer corresponding to each load transistor, and T means (the total unused time for the PLA)/(the total used time for the PLA).

For example, in a one micron (1µ) rule fabrication process for the PLA according to the present invention, a load current of 0.2 mA flows in the load transistors when the gate width of the load transistor is 1 µm.

When the number of the input lines is ten, the number of the product term lines fifty, the number of the output lines ten, and there are array transistors at all the intersections of the input lines and the product term lines, the gate capacitance of the array transistors connected to one input line is expressed as follows:

$$\begin{aligned} C &= \text{(gate capacitance per array transistor)} \times \\ &\quad \text{(number of the product term lines)} \\ &= 0.003 \, (pf) \times 50 \\ &= 0.15 \, (pf). \end{aligned}$$

Accordingly, when the cycle time f is 10 MHz, the electrical power consumption P1 of the input lines is as follows:

$$\begin{aligned} P1 &= C \times V^2 \times f \times \text{(number of input lines)} \\ &= (0.15 \times 10^{-12}) \times (5^2 \times (10 \times 10^6) \times (10) \\ &= 0.14 \, (mW). \end{aligned}$$

Thus, the power consumption of the PLA of the present embodiment according to the invention can be reduced.

Moreover, the power consumption of the PLA can be also reduced when the PLA is applied to a component, for example an instruction decoder, in a logical system LSI. In this case, the T in the formula (1) becomes half of the PLA described above.

In addition, when all product term lines and the output lines enter the activate state so that the steady current of the power source VDD to ground through the array transistors flows in the PLA, the power consumption P in the PLA becomes as follows:

$$\begin{aligned} P &= I \times V \times \text{(sum of the number of product term lines} \\ &\quad \text{and output lines)} \times 1/2 \\ &= 0.2 \times 5 \times (50 + 10) \times 1/2 \\ &= 30 \, mW. \end{aligned}$$

Thus, the power consumption of the PLA can be reduced by the present invention.

Next, the second embodiment according to the present invention will be explained.

FIG. 4 is a configuration diagram of a PLA as the second embodiment of the invention.

In the PLA, the output lines in the OR plane and the product term lines in the AND plane are cut off from the power source VDD when the PLA enter the unused state.

In the same diagram of the gate terminals, load transistor T15 in the AND plane and load transistor T16 in the OR plane are connected to an output terminal of an invertor G14 for which the input terminal is connected to the enable terminal EN.

The invertor G14 inverts the enable signal to provide the inverted enable signal to the gate terminals of the load transistors.

In the configuration of the PLA, the enable signal of the low level is provided to the enable terminal EN when the PLA enters the unused state. In this situation, all load transistors in the AND and OR planes enter the inactive state because the output of the invertor G14 is at the high level.

An electric charge on the product term line 11 flows to ground through the array transistor which enters the active state when at least one array transistor T10 connected to the product term lines 11 enters the active state in accordance with the input signal provided to the input line 10.

Therefore, no steady current flows from the power source VDD to ground through the load transistors T15 because the load transistor T15 is in the inactive state.

The electric charges on the product term lines 11 cannot flow to ground when all array transistors connected to the product term lines 11 enter the inactive state.

The operations of the other product term lines 11 are also carried out in the same manner.

On the other hand, when the enable signal enters the low level, all load transistors T16 in the OR plane enter the inactive state.

In this situation, an electric charge on the output line 12 flows to ground through the array transistor which enters the active state when at least one array transistor enters the active state in the OR plane.

Then, no steady current flows from the power source VDD to the ground through the load transistor T16 because the load transistor T16 enter the inactive state.

The electric potential of the output line 12 is maintained at the high level because no electric charge on the output line 12 flows to ground when all array transistors connected to the output line 12 enter the inactive state.

The operations of the other output lines 12 are also carried out in the same manner.

Accordingly, no steady current flows to the ground when the PLA enter the inactive state, so that the power consumption of the PLA can be reduced by the present invention.

Moreover, compared with the conventional PLA, only several logic gates (such as the invertors) and AND gates are added in the PLAs disclosed in the first and second embodiments of the present invention Next, we will explain another embodiment according to the present invention, in which this invention is applied to a precharge type programmable logic array.

Figure 5:
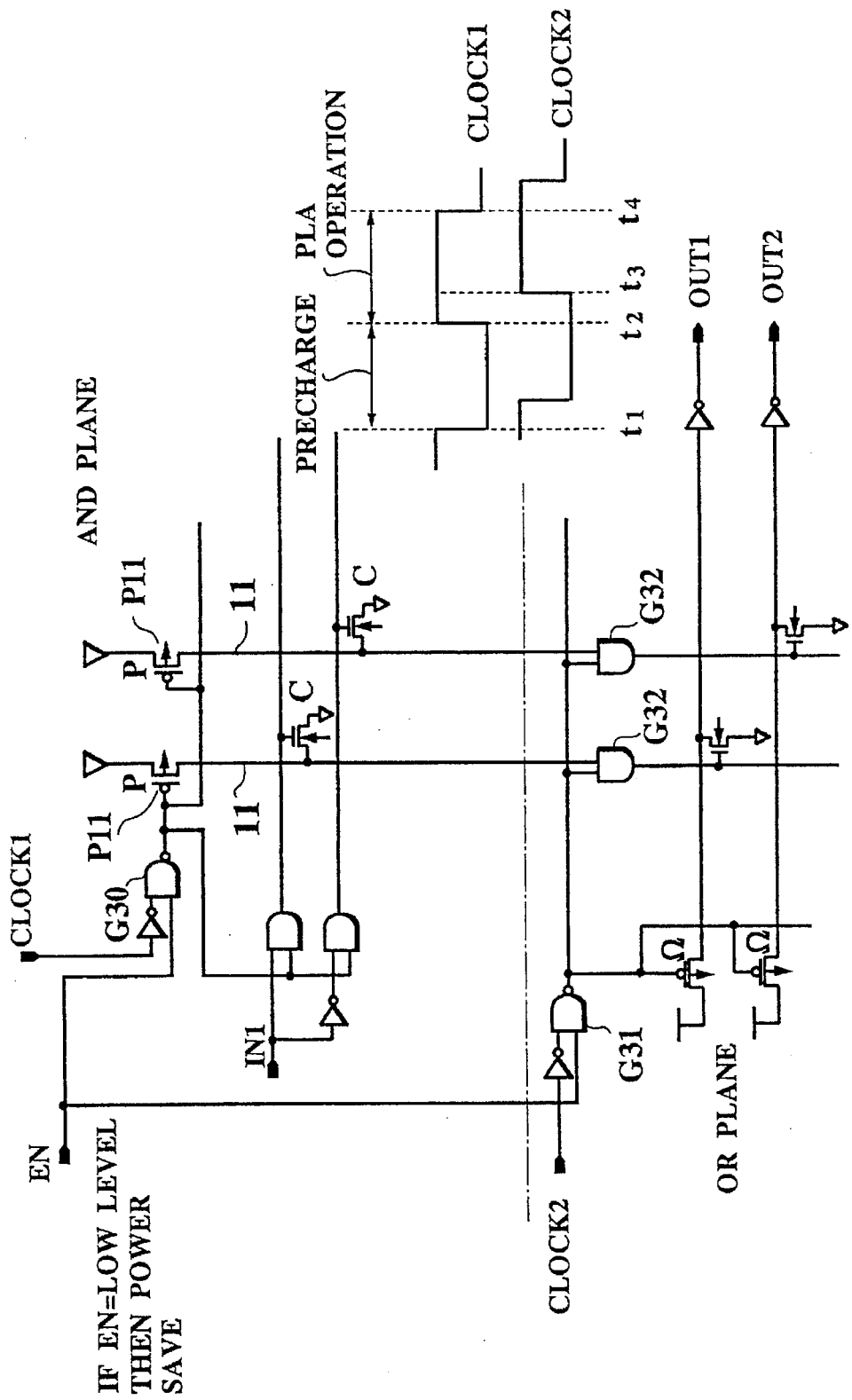
FIG. 5 is a brief configuration diagram of a precharge type PLA as a third embodiment according to the present invention.

FIG. 5 is a brief configuration diagram of a precharge type programmable logic array according to the present invention.

In an AND plane of the same diagram, the enable signal and the inverted signal of a clock signal CLOCK1 are provided to the input terminals of the NAND gate G30, then the output of the NAND gate G30 is provided to the gate of the precharge transistor P11 which keeps the product term lines 11 at a predetermined potential level.

In an OR plane, the output of the product term line 11 in the AND plane is provided to the product term lines in the OR plane through the AND gate G32.

The enable signal and the inverted signal of the clock signal CLOCK2 are provided to the input terminals of the NAND gate G31, then the signal from the NAND gate 31 is provided to one of the input terminals of the AND gate 32.

The output of the product term line in the AND plane is supplied to the other input terminal of the AND gate G32.

The phase of the clock signal CLOCK1 differs from that of the clock signal CLOCK2.

In the PLA according to the present embodiment, the PLA operates normally (namely, it enters the active state) during the time period between the times t3 and t4 as shown in FIG. 5 when the enable signal EN is in the high level. The end timing of the precharge operation in the PLA is detected at the time t3 which is a rising portion of the clock signal CLOCK2.

On the other hand, the PLA cannot operate (namely, it enters the inactive state) during the time period between the times t1 and t3 as shown in FIG. 5 when the enable signal EN is in the low level.

In the prior art, the precharge operation for the PLA is continuously executed in the activate state of the PLA.

On the other hand, like the PLA of the first and the second embodiments, the PLA of the present embodiment can also decrease its power consumption while the enable signal EN is in the low stete.

The preferred timing period between the time t2 and the time t3 may be determined in accordance with the kind of the PLA.

Next, we will explain a third embodiment according to the present invention, in which the PLA of the first to second embodiments is incorporated in a system.

Figure 6:
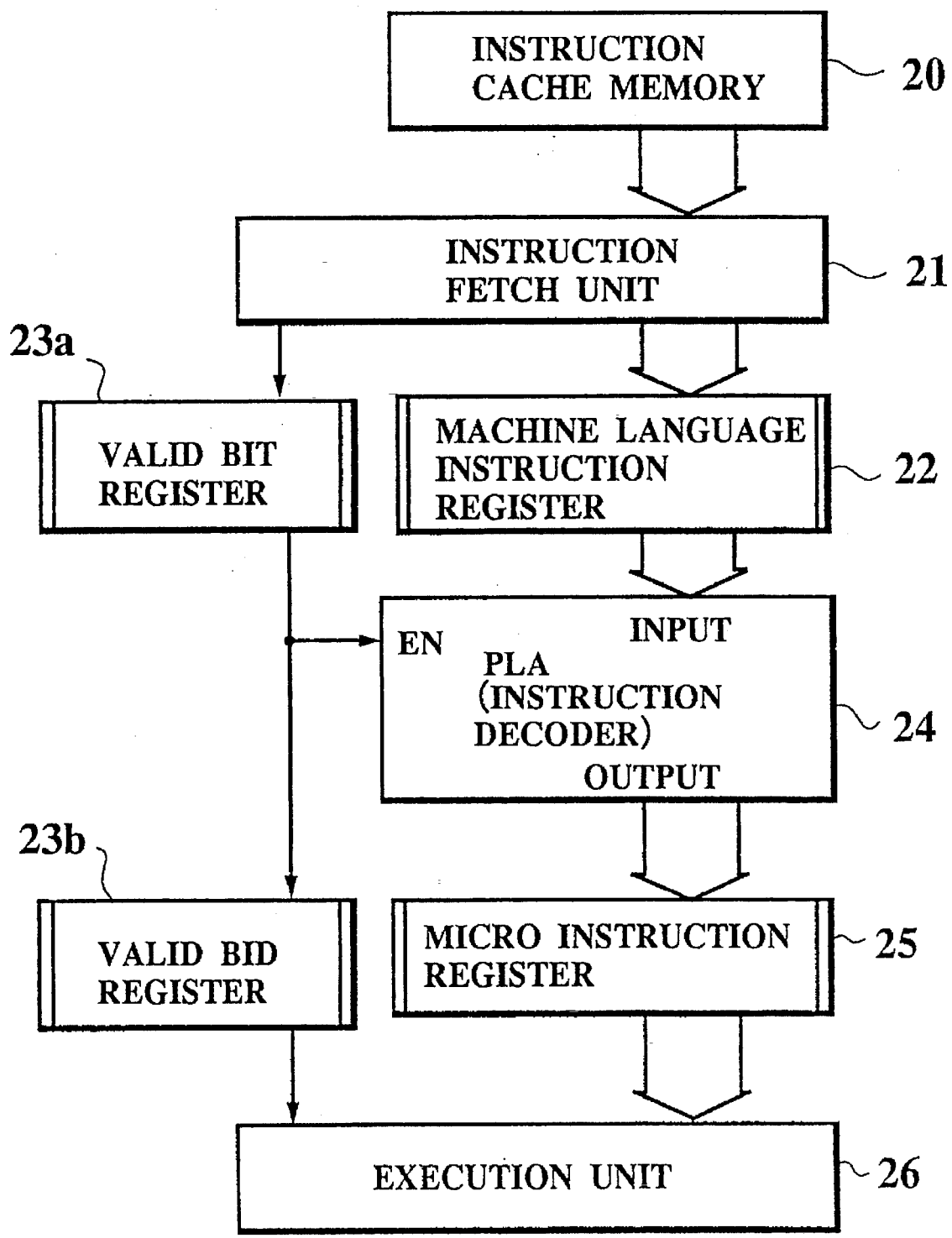
FIG. 6 is a block diagram of a data processing system as a fourth embodiment incorporating the PLA according to the present invention as an instruction decoder.

FIG. 6 is a block diagram of the third embodiment in which the PLA of the first and second embodiments is used as an instruction decoder in a microprocessor.

In this diagram, an instruction fetch unit 21 provides a machine language instruction to a machine language register 22 and sets a valid bit indicating which machine language instruction stored in the machine language register 22 is effective at the high level (H) in a valid bit register 23a when the machine language instruction is fetched by the instruction fetch unit 21 from an instruction cache memory 20.

The machine language instruction stored in the register 22 is provided to the PLA 24 which acts as the instruction decoder and the valid bit in the valid bit register 23a is transferred to the enable terminal EN as the enable signal at the next cycle.

The PLA 24 decodes the machine language instruction transferred from the machine language register 22. Then, the resultant machine language instruction decoded by the decoder 24 is transferred to the first address in a microprogram memory.

In the embodiment, the valid bit stored in the valid bit register 23a is used as the enable signal for the PLA 24.

When the operation of the PLA 24 is completed normally, a high level valid bit indicating that the operation of the PLA 24 has been completed normally is set in a valid bit register 23b.

In order to execute the machine language instruction stored in the first address in the microprogram memory in an execution unit 26, it is transferred to a micro instruction register 25, then provided to the execution unit 26 together with the valid bit stored in the valid bit register 23b at the next cycle.

On the other hand, the low level valid bit (L), indicating that the content of the machine language register 22 are meaningless, is set in the valid bit register 23a in case of an error by the instruction fetch unit 21 or when no machine language instruction is transferred to the machine language instruction 22.

In this case, the PLA enters the unused state because the enable signal in the valid bit is at the low level.

Thus, the power consumption of the PLA according to the present invention can be easily reduced by using the enable signal as the contents of the valid bit register.

Next, we will explain a fourth embodiment according to the present invention, in which the PLAs of the first and second embodiments are incorporated in a system 100 as programmable logic devices (PLDs) fabricated on one chip.

Figure 7:
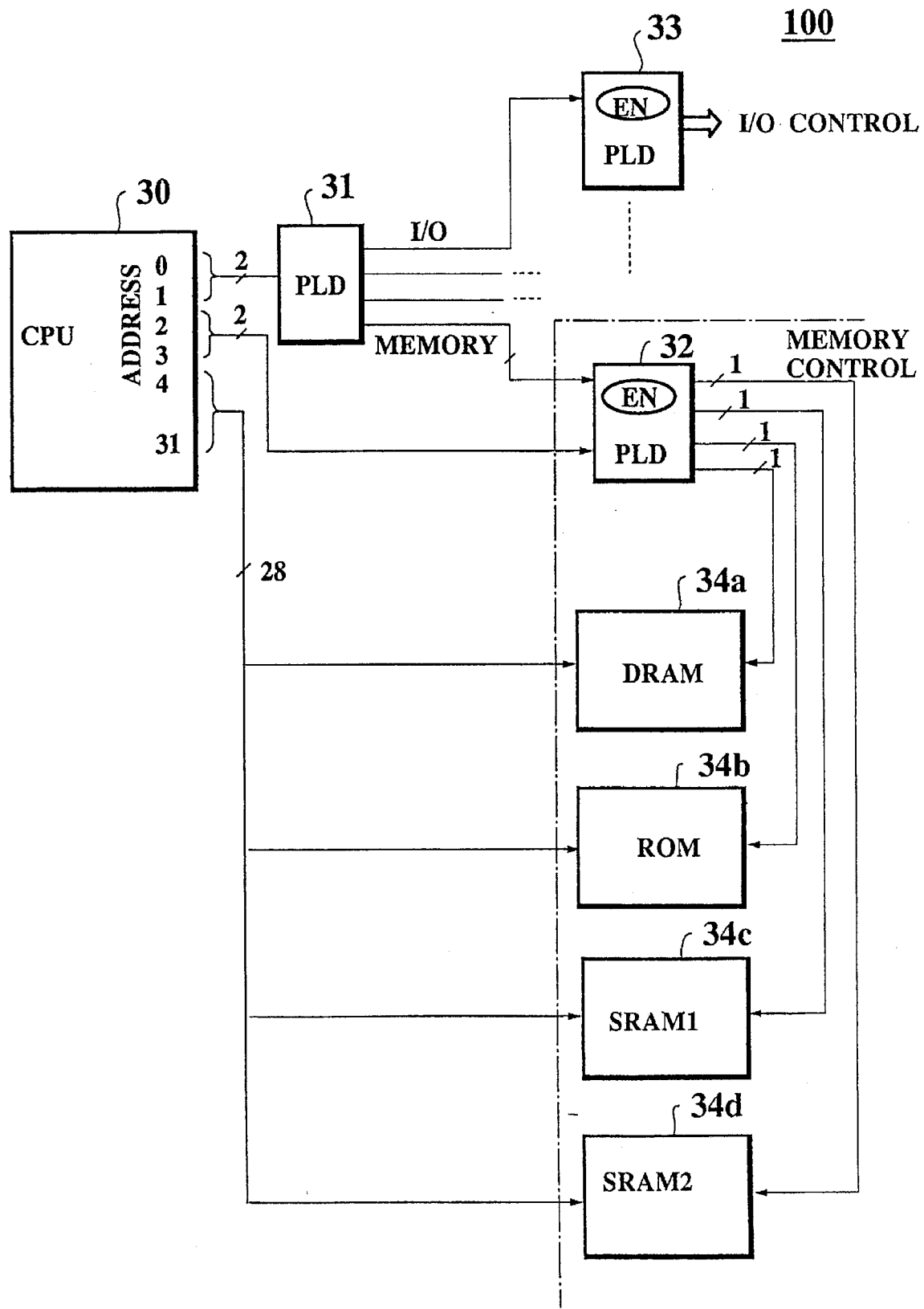
FIG. 7 is a block diagram of a data processing system on one chip incorporating the PLA according to the present invention.

FIG. 7 is a block diagram of the system with the PLDs provided together with a CPU 30 and other components on one chip.

In the system FIG. 7, the CPU 30 uses an address signal of 32 bits. There are, for example, memory regions, and I/O regions in an address space of the CPU 30.

These regions are selected by the PLD 31 as the PLA according to the present invention.

The PLD 31 decodes highest 2 bit address signals transferred from the CPU 30, then provides a selecting signal to select the regions to the PLD 32, 33, and the like.

For example, only the selecting signal corresponding to the selected memory region is at the high level, and is then transferred to the enable terminal EN of the PLD which controls the selected memory region.

At the same time, all other selecting signals which select other regions enter the low level, and are then provided to the enable terminals of the PLDs which control the other regions.

The PLD 32 is switched to the active state by the enable signal of the high level, then decodes a two bit address signal following the highest two bit address signal to control four memories such as a DRAM 34a, a ROM 34b, a SRAM1 34c, and a SRAM2 34d in the region.

In the present invention described above, the enable signal indicating whether the regions corresponding to the PLD are selected or not is provided to the enable terminal of the PLD to control the operation of the regions.

The power consumption of the PLD can be, therefore, reduced by the present invention.

Figure 8:
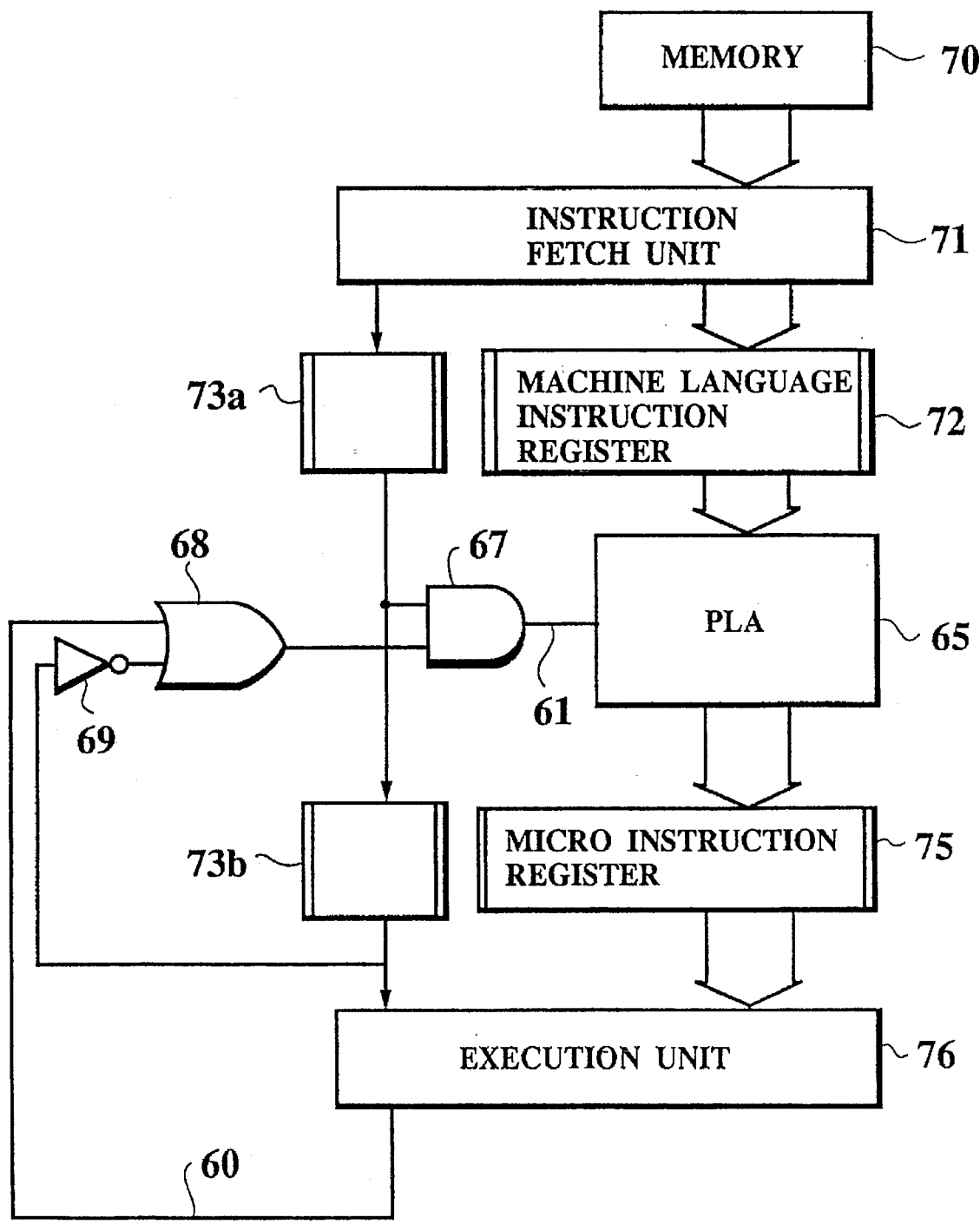
FIG. 8 is a block diagram of a data processing system incorporating the PLA according to the present invention as a fifth embodiment.

FIG. 8 is a block diagram of a data processing system based on a pipeline system as a fifth embodiment, in which the PLAs according to the first and second embodiments are used.

Figure 2:
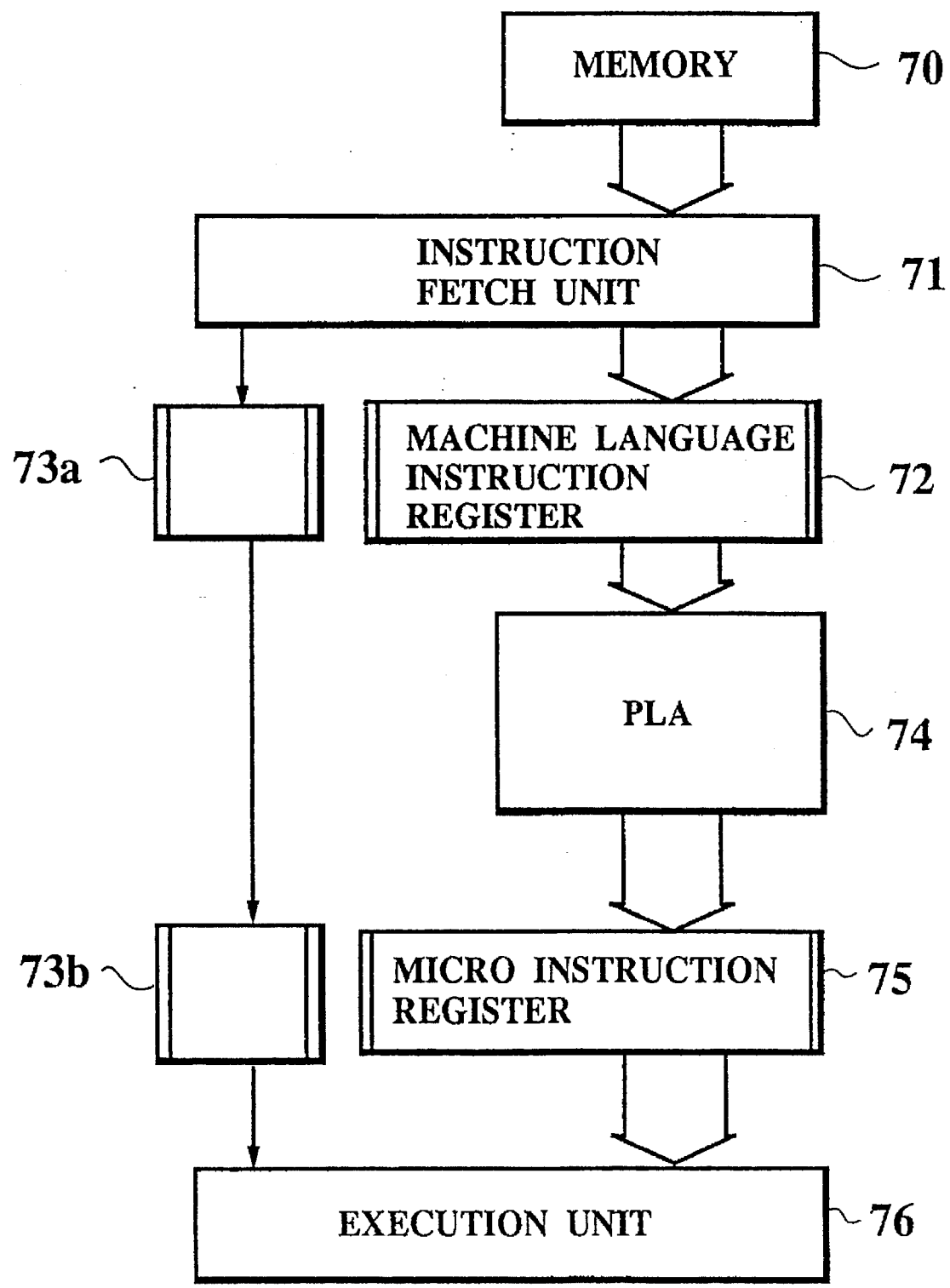
FIG. 2 is a block diagram of a conventional data processing system incorporating the PLA shown in FIG. 1.

In FIG. 8, the explanations of components designated by the same reference numerals and characters as in FIG. 2 are omitted.

An invertor 69 inverts the contents of the valid bit register 73b, then provides this data to an OR gate 68.

The OR gate 68 takes the logical sum of the output of the invertor 69 and a final signal 60 indicating the end of the operation of the execution unit 76, then provides the result to an AND gate 67.

The AND gate takes the logical product of the content of the valid bit register 73a and the output of the OR gate 68, then provides the result to the PLA 65.

The PLA 65 operates only when a PLA activation signal 61 is at the high level (H). Conversely, the PLA 65 does not operate when the PLA activation signal 61 is at the low level (H).

The operation of the PLA 65 may be stopped when the contents of the valid bit register 73a are at the low level (when the effective data is not stored in the machine language instruction register 72).

Accordingly, the AND gate 67 provides a low level enable signal to the PLA 65 when the contents of the valid bit register 73a are at the low level.

Moreover, the contents of the micro instruction register 75 should be maintained until the end operation of the execution unit 76 while the execution unit 76 1s operating even if the effective contents are stored in the machine language instruction register 75.

The OR gate 68 outputs a low level signal (L) to the AND gate 67 to halt the operation of the PLA 65 when the contents of the valid bit register 73b are at the high level (H) and the end signal indicating the end operation of the execution unit 76 are at the low level (L).

Conversly, the PLA activation signal 61 for the PLA 67 enters the high level (H) to execute the PLA 67 when the contents of the valid bit register 73b are at the low level or the end signal 60 is at the high level.

As described above in detail, the dead operation of the PLA 65 is suppressed by using the PLA activation signal 61 which is capable of controlling the operation of the PLA 65, so that the power consumption of the PLA 65 can be reduced.

A detecting means to detect whether the PLA enters the active state or the inactive state by the present invention is easily provided, as described in the third, fourth, and fifth embodiments as shown in FIGS. 6, 7, and 8. In particular one of the PLAs incorporated in an integrated system by using the selecting signal as the enable signal described above in these embodiments in detail is readily selected.

The concept of the present invention is not limited by the embodiments described above, but for example, can be applied to a RAM or an ROM and the other components of a data processing system.

Various modifications will become possible for those skilled in the art after the teaching of the present disclosure without departing from the scope thereof.

What is claimed is:

1. A data processing system, comprising:

instruction fetch means for executing a fetch operation to fetch an instruction to be executed and transmitting an enable signal of a first level indicating that the fetch operation has completed successfully and for transmitting the enable signal of a second level indicating that the fetch operation has failed;

a programmable logic array (PLA) for decoding the instruction transferred from the instruction fetch means, said PLA comprising:

an AND plane having a plurality of input lines and a plurality of product term lines crossing the input lines;

an OR plane having the product term lines and a plurality of output lines crossing the product term lines;

a power source providing electrical power to the AND and OR planes; and connection control means comprising a first control means and a second control means, the first control means being connected to the plurality of the product term lines in the AND plane, the second control means being connected to the plurality of the output lines in the OR plane, for controlling the supply of the electrical power to the AND and OR planes;

first register means for storing the enable signal of the first level transferred from the instruction fetch means indicating the successful completion of the fetch operation executed by the instruction fetch means and for transmitting the enable signal of the first level to the connection control means in the PLA; and information processing means for executing an execution operation to execute the instruction decoded by the PLA, wherein the connection control means supplies the electrical power from the power source to the AND plane and the OR plane to enter the PLA into an active state only when the PLA receives the enable signal of the first level transmitted from the first register means.

2. A data processing system as claimed in claim 1, wherein the first level is a high level and the second level is a low level.

3. A data processing system, comprising:

instruction fetch means for performing a fetch operation to fetch an instruction to be executed and transmitting a first enable signal of a first level indicating successful completion of the fetch operation and for transmitting the first enable Signal of a second level indicating that the fetch operation has failed;

a programmable logic array for decoding the instruction transferred from the instruction fetch means, said PLA comprising:

an AND plane having a plurality of input lines and a plurality of product term lines crossing the input lines;

an OR plane having the product term lines and a plurality of output lines crossing the product term lines;

a power source providing electrical power to the AND and OR planes; and connection control means comprising a first connection control means and a second connection control means, the first connection control means being connected to the plurality of the product term lines in the AND plane, the second connection control means being connected to the plurality of the output lines in the OR plane, for controlling the supply of the electrical power to the AND and OR planes;

first register means for storing the first enable signal of the first level transmitted from the instruction fetch means and for transmitting the first enable signal of the first level;

information processing means for executing an execution operation to execute the instruction decoded by the PLA and transmitting a completion signal of a first level indicating that the execution operation of the information processing means has completed; and first control means for receiving the first enable signal of the first level from the first register means and the completion signal of the first level from the information processing means, for performing a logical AND operation between the first enable signal of the first level and the completion signal of the first level, and for transmitting the first enable signal to the PLA when both the first enable signal and the completion signal, are at the first level, wherein the connection control means supplies the electrical power from the power source to the AND plane and the OR plane in order to enter the PLA into an active state only when the PLA receives the first enable signal of the first level transmitted from the first control means.

4. A data processing system as claimed in claim 3, further comprising:

second register means for temporarily storing the instruction decoded by the PLA and transmitting a second enable signal of a first level indicating that the second register means has stored the instruction;

second control means for reversing the level of the second enable signal of the first level from the second register means and transmitting the reversed second enable signal of a first level; and third control means for receiving the completion signal of the first Level from the information processing means and the reversed second enable signal from the second control means, for performing a logical OR operation of the completion signal of the first level and the reversed second enable signal, and for transmitting a result of the logical OR operation to the first control means.

5. A data processing system as claimed in claim 4, wherein the first level of the second enable signal is a high level.

6. A data processing system as claimed in claim 3, wherein the first level is a high level and the second level is a low level.

* * * * *